(12) United States Patent
Inui

(10) Patent No.: US 6,449,387 B1
(45) Date of Patent: Sep. 10, 2002

(54) METHOD FOR ANALYZING LIGHT INTENSITY DISTRIBUTION

(75) Inventor: Hirotomo Inui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/332,730

(22) Filed: Jun. 14, 1999

(30) Foreign Application Priority Data

Jun. 15, 1998 (JP) .......................................... 10-167556

(51) Int. Cl.$^7$ ................................................. G06K 9/00
(52) U.S. Cl. ............................ 382/144; 382/145; 430/5
(58) Field of Search ........................ 382/141, 143–149, 382/150; 348/86, 87, 125, 126, 127; 356/237.1, 237.6, 606; 430/5, 130; 715/15, 16

(56) References Cited

U.S. PATENT DOCUMENTS

| 5,898,182 A | * | 4/1999 | Toyama | ........................ 250/548 |
| 6,177,993 B1 | * | 1/2001 | Sommargren | ............... 356/337 |

FOREIGN PATENT DOCUMENTS

| EP | 0 307 726 A2 | 3/1989 |
| JP | 7-78737 | 3/1995 |
| JP | 2531114 | 6/1996 |
| JP | 9-45600 | 2/1997 |
| JP | 9-237750 | 9/1997 |
| JP | 10-004048 | 1/1998 |
| JP | 10-282635 | 10/1998 |

OTHER PUBLICATIONS

Y.C. Pati, et al., Phase–Shifting Masks for Microlithography: Automated Design and Mask Requirements,: J. Opt. Soc. Am. A/vol. 11, No. 9 (Sep. 1994).

* cited by examiner

*Primary Examiner*—Joseph Mancuso
*Assistant Examiner*—Vikkram Bali
(74) *Attorney, Agent, or Firm*—Scully, Scott, Murphy & Presser

(57) ABSTRACT

A processing unit cuts out, from a selected mask pattern, a rectangular area pattern ($S_k \times S_k$) having the size equal to an optical system term kernel $\phi 1$ associated with coordinates (X, Y) on a wafer. The processing unit further cuts out, from the rectangular area pattern ($S_k \times S_k$), fine grid rectangular area patterns ($S_j \times S_j$) having the size equal to an optical system term kernel $\phi 2$ associated with coordinates (x, y) contained in a predetermined range from the coordinates (X, Y). The processing unit discriminates the transmission factors F of the fine grid rectangular areas divided at fine grid intervals $dx_f$, and determines whether all the transmission factors F of the fine grid rectangular areas of the mask pattern are 0 or 1. When the processing unit determines that all the transmission factors F of the fine grid rectangular areas are 0 or 1, the processing unit 1 performs convolution integration with respect to the kernel $\phi 1$ corresponding to the coordinates (X, Y) and the transmission factor F of the mask pattern 22, thereby calculating the light intensity I (X, Y) at a position specified by the coordinates (X, Y) on the wafer. When the processing unit 1 does not determine that all the transmission factors F of the fine grid rectangular areas are 0 or 1, the processing unit performs the convolution integration with respect to the kernel $\phi 2$ corresponding to the coordinates (x, y) and the transmission factor F of the mask pattern 22, thereby calculating the light intensity I (x, y) at a position specified by coordinates (x, y) on the wafer.

13 Claims, 5 Drawing Sheets

METHOD FOR ANALYZING LIGHT INTENSITY DISTRIBUTION

BACKGROUND OF THE INVENTION

1. Field of the Invention

The present invention relates to a technique for analyzing light intensity distribution on an light exposure area where a mask pattern will be projected.

2. Description of the Related Art

A semiconductor device manufacturing process includes the photolithography step of shaping a photoresist film formed on a wafer into the desired form by a patterning technique. In this photolithography step, as illustrated in FIG. 4, light coming from a light source 11 passes through a mask 12 and is thereafter condensed by a lens 13 so as to be projected onto the photoresist film 14 formed on the wafer 15. However, the resultant resist pattern on the wafer 15 does not always have the same shape as a pattern printed on the mask 12. In consideration of this, the pattern needs to be printed on the mask 12 so that the resist pattern projected on the wafer 15 will be within an allowable design range.

To this end, the correspondence between the pattern printed on the mask and the resist pattern needs to be grasped. According to a conventionally known method, the intensity of light which will be projected on a light exposure area of a wafer to be exposed to light is analyzed through simulation, without the photoresist film being actually subjected to light.

The document "Y. C. Pati. et al. J. Opt. Soc. Am. A/Vol. 11, No. 9, 1994" discloses a light intensity calculating method for use in the case where the optical simulation of a stepper optical system, which is a kind of light exposure apparatus, is executed as such photolithographic simulation. According to the OCA (Optimal Coherent Approximation) method disclosed thereby, the light intensity (x, y) at the position specified by coordinates (x, y) on the light exposure area of the wafer is expressed by Equation (1) shown below:

$$I(x, y) = \Sigma \alpha |(F \times \phi)(x, y)|^2 \quad (1)$$

where $\alpha$ and $\phi$ represent optical kernels determined by the stepper optical system (light exposure apparatus), F represents the transmission factor of the mask, and $(F \times \phi)(x, y)$ is the convolution integral of F and $\phi$.

A conventional light intensity analyzing method which adopts Equation (1) shown above will now be described with reference to the flowchart of FIG. 5. The process shown in this flowchart is executed by an information processing apparatus such as an engineering workstation.

Firstly, the kernel $\phi$ corresponding to each set of coordinates (x, y) on a wafer surface area when divided into a grid of areas at predetermined grid intervals $dx_f$, are calculated and stored in a table (a step S201). The kernel $\phi$ is a value representing the extent of the mask which optically influences the coordinates (x, y) on the wafer. A rectangular area $(S_k \times S_k)$, which has the size $(S_k)$ equal to the kernel $\phi$ associated with a given set of coordinates (x, y), and which is located at a position corresponding to that specified by the given set of coordinates (x, y), is cut out from the mask pattern (a step S202).

Next, data representing the shape of the mask is developed into a bit map at grid intervals $dx_f$, and the transmission factor F of the mask at the rectangular area is obtained (a step S203). The convolution integral $(F \times \phi)(x, y)$ of the transmission factor F and the kernel $\phi$ is calculated and the calculated integral is adopted in Equation (1), thus obtaining the light intensity I (x, y) at the position specified by the given set of coordinates (x, y) on the wafer (a step S204).

Thereafter, it is determined whether the light intensities I (x, y) at the positions on the wafer, which positions are specified by all sets of target coordinates (x, y), have been calculated or not (a step S205). If it is determined that the light intensities I (x, y) at the positions specified by all sets of target coordinates (x, y) have not yet been calculated, then the same calculation as that described above is performed in connection with the position specified by the next set of coordinates. On the other hand, if it is determined that the light intensities I (x, y) at the positions specified by all sets of target coordinates (x, y) have been calculated, the entire light intensity distribution is output as the result of the analysis (a step S206). Then, the process shown in the flowchart is terminated.

However, in the case of analyzing the light intensity distribution with the conventional method described above, the grid intervals $dx_f$ at which the shape of the mask is developed into the bit map needs to be set at a satisfactorily small value in order to correctly evaluate the shape of the resist pattern which will be formed on the wafer. When calculating the convolution integral of the transmission factor F in connection with each of the rectangular areas divided at fine grid intervals set at such a small value, the calculation time is considerably long and the time required for the analysis is accordingly long.

Japanese Patent No. 2531114 and Unexamined Japanese Patent Application KOKAI Publication No. H9-237750 disclose light intensity distribution analyzing methods intended to reduce the time required for the analysis of the light intensity distribution. However, according to the methods disclosed thereby, the light intensity distribution is analyzed using Fourier transform. The techniques disclosed by the above patent and publication cannot be adopted as they are in a method for calculating the light intensity through utilization of the convolution integral.

SUMMARY OF THE INVENTION

It is accordingly an object of the present invention to provide a method and an apparatus which are capable of analyzing the light intensity distribution on a light exposure area within a short period of time, and a computer program product including a computer usable medium which contains a computer readable program embodied therein for the analysis of the light intensity distribution.

According to the first aspect of the present invention which aims to achieve the above object, there is provided a method for analyzing light intensity distribution on a light exposure area where a shape of a mask pattern will be projected through an optical system by exposure light coming from a light source, the analyzing method comprising:

dividing the light exposure area into first areas at predetermined first intervals;

cutting out first portions of the mask pattern which correspond to the first areas;

sequentially determining whether transmission areas which transmit the exposure light and non-transmission areas which do not transmit the exposure light are mingled at the cut-out first portions of the mask pattern;

calculating intensities of light which will be projected on the light exposure area, through use of the first portion of the mask pattern, when it is determined that the transmission areas and the non-transmission areas are not mingled; and dividing each of the first areas into second areas at second intervals smaller than the first intervals and calculating intensities of light which will be projected on the light exposure area, through use of second portions of the mask pattern which correspond to the second areas, when it is determined that the transmission areas and the non-transmission areas are mingled.

According to the above method, only in the case where the transmission areas and the non transmission areas are mingled at the first portions of the mask pattern, the light intensity is calculated through use of the second portions of the mask pattern which correspond to the second areas into which each of the first areas have been divided. In the case where the transmission areas and the non transmission areas are not mingled, the light intensity is calculated through use of the first portions of the mask pattern which correspond to the first areas. Because of this, the number of times the light intensity calculation is performed to analyze the light intensity distribution over the entirety of the light exposure area is reduced. Accordingly, the time required for the analysis of the light intensity calculation is reduced.

In the above-described method, each of the first areas has a shape of a rectangle with four sides each being $100\,\lambda/NA$ to $200\,\lambda/NA$ (nm) in length, while each of the second areas has a shape of a rectangle with four sides each being $10\,\lambda/NA$ to $20\,\lambda/NA$ (nm) in length, where $\lambda$ presents a wavelength (nm) of the exposure light, while NA represents an numerical aperture of the optical system.

The above method may further comprise cutting out the second portions of the mask pattern which correspond to the second areas from each of the first portions of the mask pattern, after cutting out the first portions of the mask pattern. Determining whether the transmission areas and the non-transmission areas are mingled at the first portions of the mask pattern may be performed by determining whether areas having a transmission factor of 0 and areas having a transmission factor of 1 are mingled at the second portions of the mask pattern.

The above-described method may further comprise calculating all optical kernels $\phi 1$ corresponding to the first areas; and calculating all optical kernels $\phi 2$ corresponding to the second areas.

The optical kernels $\phi 2$ may be calculated by performing primary interpolation based on the optical kernels $\phi 1$.

The light intensities I (X, Y) at the positions specified by coordinates (X, Y) on the first areas and the light intensities I (x, y) at the positions specified by coordinates (x, y) on the second areas may be calculated respectively by:

$$I(X,\ Y)=\Sigma\alpha|(F\times\phi 1)(X,\ Y)|^2 \quad (1)$$

$$I(x,\ y)=\Sigma\alpha|(F\times\phi 2)(x,\ y)|^2 \quad (2)$$

where $\alpha$ represents optical kernels, and F represents transmission factors of the first and second portions of the mask pattern which correspond to the first and second areas.

When the light intensities I (X, Y) at the positions specified by the coordinates (X, Y) on the first areas are calculated, the light intensities I (x, y) at the positions specified by the coordinates (x, y) on the second areas corresponding to the first areas can be given as I (X, Y).

The above-described method may further comprise: storing, in a predetermined table, the calculated intensities of light which will be projected on the first areas; storing, in the predetermined table, the calculated intensities of light which will be projected on the second areas; and outputting contents of the predetermined table as light intensity distribution analyzing results when light intensities over an entirety of the light exposure area have been stored in the predetermined table.

According to the second aspect of the present invention which aims to attain the aforementioned object, there is provided an analyzing apparatus for analyzing light intensity distribution on a light exposure area where a shape of a mask pattern will be projected through an optical system by exposure light coming from a light source, the analyzing apparatus comprising:

a storage unit which stores a program for dividing the light exposure area into first areas at predetermined first intervals, cutting out first portions of the mask pattern which correspond to the first areas, sequentially determining whether transmission areas which transmit the exposure light and non-transmission areas which do not transmit the exposure light are mingled at the cut-out first portions of the mask pattern, calculating intensities of light which will be projected on the light exposure area, through use of the first portions of the mask pattern, when it is determined that the transmission areas and the non-transmission areas are not mingled, and dividing each of the first areas into second areas at second intervals smaller than the first intervals and calculating intensities of light which will be projected on the light exposure area, through use of second portions of the mask pattern which correspond to the second areas, when it is determined that the transmission areas and the non-transmission areas are mingled;

a processing unit which sequentially executes the program stored in the storage unit and analyzes the light intensity distribution on the light exposure area; and an output device which outputs a result of analysis of the light intensity distribution analyzed by the processing unit.

In the above-described apparatus, the storage unit may store mask patterns. In this case, the apparatus may further comprise an input device which selects a desired pattern from among the mask patterns stored in the storage unit, and the processing unit may perform processing in accordance with the mask pattern selected by the input device.

According to the third aspect of the present invention which aims to attain the aforementioned object, there is provided an analyzing apparatus for analyzing light intensity distribution on a light exposure area where a shape of a mask pattern will be projected through an optical system by exposure light coming from a light source, the analyzing apparatus comprising:

means for dividing the light exposure area into first areas at predetermined first intervals;

means for sequentially determining whether transmission areas which transmit the exposure light and non-transmission areas which do not transmit the exposure light are mingled at first portions of the mask pattern which correspond to the first areas;

means for calculating intensities of light which will be projected on the light exposure area, through use of first portions of the mask pattern, when it is determined that the transmission areas and the non-transmission areas are not mingled; and means for dividing each of the first areas into second areas at second intervals smaller than the first intervals and calculating intensities of light which will be projected on the light exposure area, through use of second portions of the mask pattern which correspond to the second areas, when it is determined that the transmission areas and the non-transmission areas are mingled.

According to the fourth aspect of the present invention which aims to attain the aforementioned object, there is provided a computer program product including a computer usable medium which contains a computer readable program embodied therein for analyzing light intensity distribution on a light exposure area where a shape of a mask pattern will be projected through an optical system by exposure light coming from a light source, the program executing:

dividing the light exposure area into first areas at predetermined first intervals;

sequentially determining whether transmission areas which transmit the exposure light and non-transmission areas which do not transmit the exposure light are mingled at portions of the mask pattern which correspond to the first areas;

calculating intensities of light which will be projected on the light exposure area, through use of first portions of the mask pattern, when it is determined that the transmission areas and the non-transmission areas are not mingled; and dividing each of the first areas into second areas at second intervals smaller than the first intervals and calculating intensities of light which will be projected on the light exposure area, through use of second portions of the mask pattern which correspond to the second areas, when it is determined that the transmission areas and the non-transmission areas are mingled.

According to the fifth aspect of the present invention which aims to attain the aforementioned object, there is provided a program, embedded in a carrier wave, for analyzing light intensity distribution on a light exposure area where a shape of a mask pattern will be projected through an optical system by exposure light coming from a light source, the program executing:

dividing the light exposure area into first areas at predetermined first intervals;

sequentially determining whether transmission areas which transmit the exposure light and non-transmission areas which do not transmit the exposure light are mingled at portions of the mask pattern which correspond to the first areas;

calculating intensities of light which will be projected on the light exposure area, through use of first portions of the mask pattern, when it is determined that the transmission areas and the non-transmission areas are not mingled; and dividing each of the first areas into second areas at second intervals smaller than the first intervals and calculating intensities of light which will be projected on the light exposure area, through use of second portions of the mask pattern which correspond to the second areas, when it is determined that the transmission areas and the non-transmission areas are mingled.

BRIEF DESCRIPTION OF THE DRAWINGS

The aforementioned object and other objects and advantages of the present invention will become more apparent upon reading of the following detailed description and the accompanying drawings in which.

DETAILED DESCRIPTION OF THE PREFERRED EMBODIMENT

An embodiment of the present invention will now be described with reference to the accompanying drawings.

Figure 4:
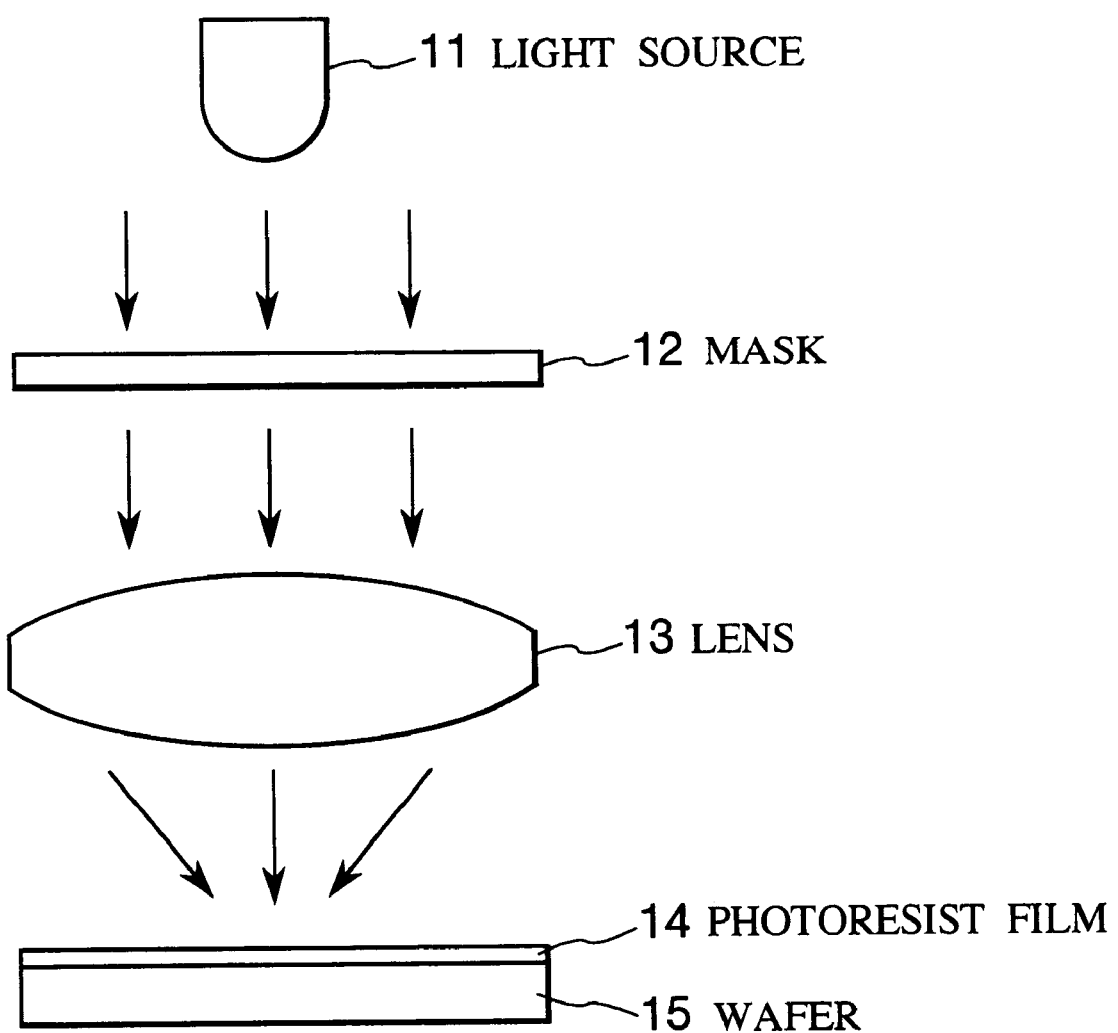
FIG. 4 is a diagram for explaining the photoresist film formation step of a semiconductor device manufacturing method.

This embodiment is applied to the analysis of the light intensity distribution on a wafer during the photolithographic step of the semiconductor device manufacturing process explained in the description of the related art with reference to FIG. 4. In this embodiment, the light intensity on a light exposure area is analyzed through a simulation which is performed by an engineering workstation, without a photoresist film being actually exposed to light by using a light exposure apparatus.

Figure 1:
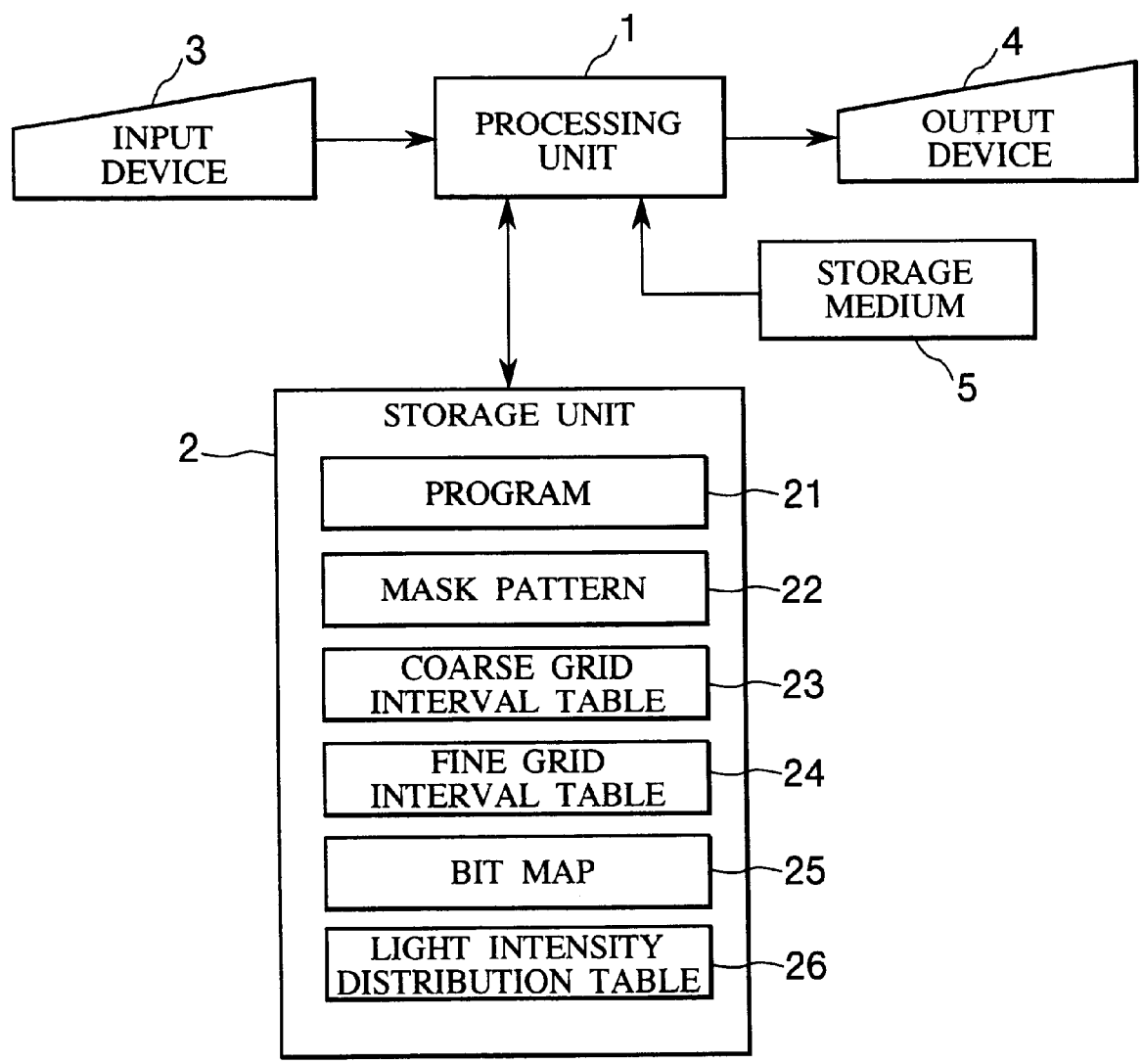
FIG. 1 is a diagram showing the structure of an engineering workstation employed in an embodiment of the present invention.

FIG. 1 is a diagram showing the structure of the engineering workstation employed in this embodiment. As illustrated, the engineering workstation comprises a processing unit 1, a storage unit 2, an input device 3 and an output device 4. A storage medium 5 such as a CD-ROM is detachably inserted in the engineering workstation.

The storage unit 2 stores a program 21 shown in a flowchart which will be explained later, a mask pattern 22 to be analyzed, a coarse grid interval table 23, a fine grid interval table 24, a bit map 25 and a light intensity distribution table 26. The mask pattern 22 is selected from among a variety of mask patterns in accordance with an input from the input device 3. The coarse grid interval table 23, the fine grid interval table 24 and the bit map 25 are intermediate data for attaining the result of the analysis of light intensity distribution. The light intensity distribution table 26 is a table which stores the result of the processing effected by the processing unit 1, that is, the light intensities calculated in relation to the positions specified by all sets of coordinates.

The processing unit 1 executes the program 21 transferred to the storage unit 2 from the storage medium 5, and generates the light intensity table 26 by calculating the light intensity at the position specified by each set of coordinates on a wafer, while generating the coarse grid interval table 23, the fine grid interval table 24 and the bit map 25 during the execution of the program. The processing unit 1 transfers the program 21 stored in the storage medium 5 to the storage unit 2.

A predetermined instruction and data are input from the input device 3 to the processing unit 1 in accordance with an operator's manipulation. The output device 4 outputs, to the outside of the workstation, the light intensity distribution table 26 which is the result of the processing performed by the processing unit 1.

Figure 2:
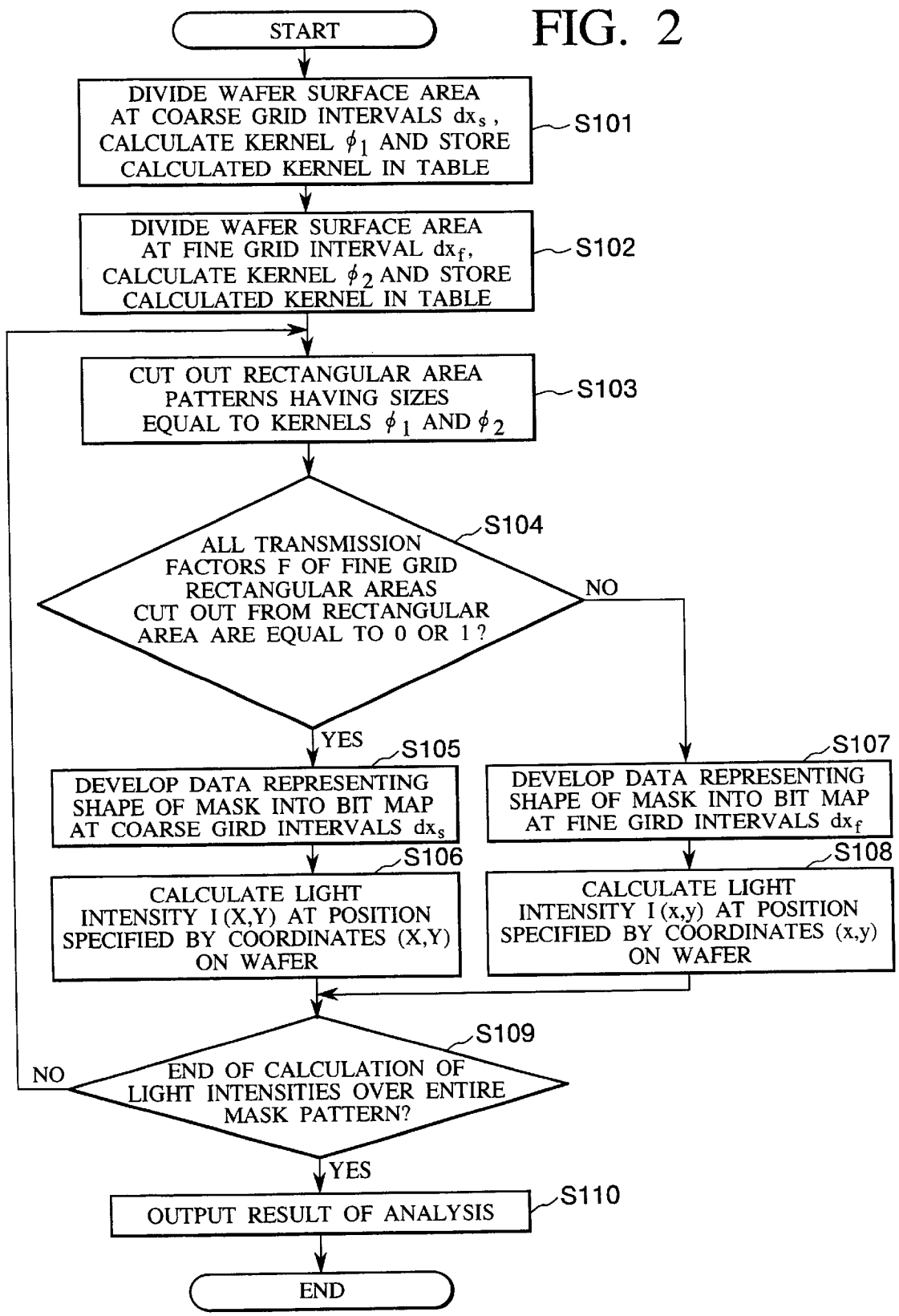
FIG. 2 is a flowchart showing a process for analyzing the light intensity distribution according to the aforementioned embodiment of the present invention.

A process for analyzing the light intensity distribution according to this embodiment will now be described. FIG. 2 is a flowchart showing the light intensity distribution analyzing process of this embodiment. The process shown 25 in this flowchart starts when an operator selects the mask pattern 22 by operating the input device 3 and inputs a process start instruction from the input device 3.

Firstly, the processing unit 1 divides a surface area of a wafer into a coarse grid pattern of areas (hereinafter referred to as the coarse grid rectangular areas) at coarse grid intervals $dx_s$ of e.g. 100 nm, after which the processing unit 1 calculates the optical kernel $\phi 1$ corresponding to the coarse grid intervals $dx_s$, and causes the storage unit 2 to store the calculated kernel in the coarse grid interval table 23 (a step S101). The processing unit 1 divides the wafer surface area into a fine grid pattern of areas (hereinafter referred to as the fine grid rectangular areas) at fine grid intervals $dx_f$ e.g. 20 nm. Performing the primary interpolation based on the kernel φ1 stored in the coarse grid interval table 23, the processing unit 1 calculates the optical kernel φ2 in relation to each set of coordinates (x, y) on the wafer, and causes the storage unit 2 to store the calculated kernel in the fine grid interval table 24 (a step S102). The capital letters "X, Y" and the small letters "x, y" are used merely to distinguish the division at the coarse grid intervals and the division at the fine grid intervals from each other, and the coordinates (X, Y) and (x, y) are present on the same coordinate system. The coordinates (X, Y) and (x, y) specify the positions of the centers of the areas into which the wafer surface area has been divided at their respective grid intervals.

The processing unit 1 cuts out, from the selected mask pattern 22, a rectangular area pattern ($S_k \times S_k$) having the size equal to the kernel φ1 calculated in relation to the coordinates (X, Y) on the wafer. The processing unit 1 further cuts out, from the rectangular area pattern ($S_k \times S_k$), fine grid rectangular area patterns ($S_j \times S_j$) having the size equal to the kernel φ2 calculated in relation to the coordinates (x, y) contained in a predetermined range from the coordinates (X, Y) (a step S103).

Then, the processing unit 1 discriminates the transmission factors F of the respective fine grid rectangular areas divided at the fine grid intervals $dx_f$ when the rectangular area ($S_k \times S_k$) has been developed into the bit map 25 at the fine grid intervals $dx_f$, and the processing unit 1 determines whether all the transmission factors F of the fine grid rectangular areas of the mask pattern 22 are 0 or 1 (a step S104).

When the processing unit 1 determines that all the transmission factors F of the fine grid rectangular areas are 0 or 1, in other words, when the processing unit 1 determines that the shape of the mask pattern 22 is coarse in the rectangular area ($S_k \times S_k$), then the processing unit 1 develops that part of the mask pattern 22 which corresponds to the rectangular area ($S_k \times S_k$) into the bit map 25 at the coarse grid intervals $dx_s$ (a step S105). Using the coarse grid interval table 23, the processing unit 1 performs convolution integration ((F×φ1) (X, Y)) with respect to the kernel φ1 corresponding to the coordinates (X, Y) and the transmission factor F of the mask pattern 22. Putting values obtained as a result of the convolution integration into Equation (1) presented previously, the processing unit 1 calculates the light intensity I (X, Y) at the position specified by the coordinates (X, Y) on the wafer. After this, the processing unit 1 causes the light intensity table 26 to store the calculated light intensity as the light intensity I (x, y) at the position specified by the coordinates (x, y) included in the coarse grid coordinates (X, Y) (a step S106).

On the other hand, when the processing unit 1 does not determine that all the transmission factors F of the fine grid rectangular areas are 0 or 1, in other words, when the processing unit 1 determines that the shape of the mask pattern 22 is fine at the rectangular area ($S_k \times S_k$), then the processing unit 1 develops that part of the mask pattern 22 which corresponds to the rectangular area ($S_k \times S_k$) into the bit map 25 at the fine grid intervals $dx_f$ (a step S107). Using the fine grid interval table 22, the processing unit 1 performs convolution integration ((F×φ2) (x, y)) with respect to the kernel φ2 corresponding to the coordinates (x, y) and the transmission factor F of the mask pattern 22. Putting values obtained as a result of the convolution integration into Equation (1) presented previously, the processing unit 1 calculates the light intensity I (x, y) at the position specified by the coordinates (x, y) on the wafer. Then, the processing unit 1 causes the light intensity table 26 to store the calculated light intensity (a step S108).

Having finished the calculation of the light intensity I (X, Y) or I (x, y) in the step S106 or S108, the processing unit 1 determines whether the analysis of the light intensity at that part of the wafer which corresponds to the selected mask pattern 22 has been completed with respect to all sets of coarse grid coordinates (X, Y) (a step S109). When the processing unit 1 determines that the analysis has not yet been completed, the processing unit returns to the step S103, and repeats the same steps as those described above with respect to the next set of coordinates.

Until completing the analysis with respect to all sets of coordinates (X, Y), the processing unit 1 repeats the procedures of the steps S103, S104, S104, S105, S106 and S109, or the procedures of the steps S103, S104, S107, S108 and S109. When the processing unit 1 determines in the step S109 that the analysis has been completed with respect to all sets of coordinates (X, Y), then the processing unit 1 causes the output device 4 to output, as the result of the analysis, the light intensity distribution table 26 in which the light intensities I (x, y) at the positions specified by all fine grid coordinates (x, y) on the wafer are stored (a step S110). Then, the processing unit 1 ends the process shown in the flowchart.

In the above explanation, the coarse grid intervals $dx_s$ are set at 100 nm, while the fine grid intervals $dx_f$ are set at 20 nm. However, the coarse grid intervals $dx_s$ and the fine grid intervals $dx_f$ can be set at arbitrary values according to the optical system (exposure apparatus) and the mask pattern design. From the sampling intervals and calculation time necessary to express the pupil function, discrete values for the kernels are derived as 40 to 50. Hence, when λ (nm) and NA represent the wavelength of exposure light and the numerical aperture, respectively, the coarse grid intervals $dx_s$ can be set at 100 λ/NA to 200 λ/NA (nm).

Meanwhile, the precision of the bit map 25 can be set at 5% to 10% of the mask design rule. Accordingly, the fine grid intervals $dx_f$ can be set at 10 λ/NA to 20 λ/NA (nm). For example, in the case where a KrF stepper is employed, the mask design rule is 0.25 μm and consequently the fine grid intervals $dx_f$ are 10 nm to 20 nm.

Figure 5:
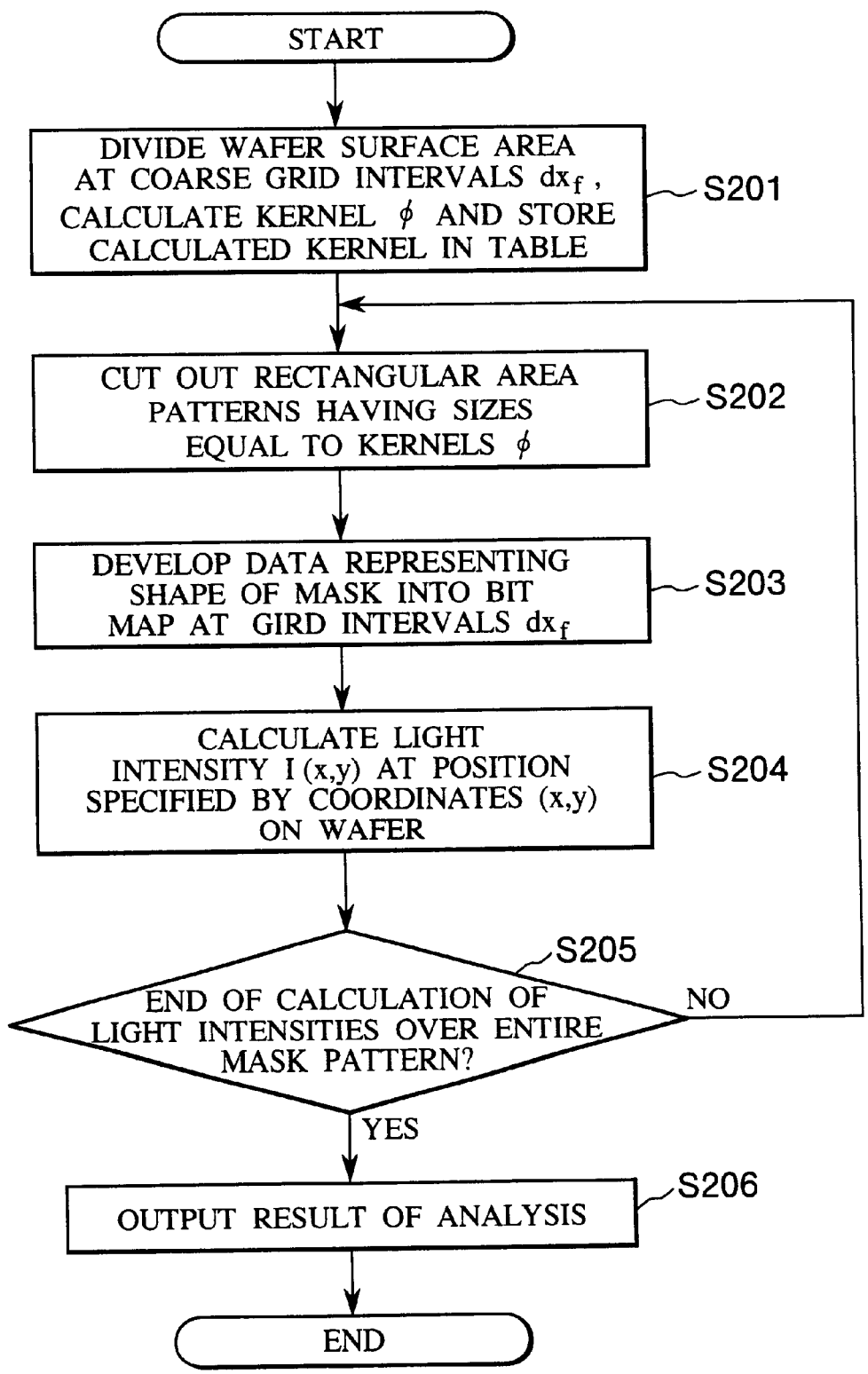
FIG. 5 is a flowchart showing a conventional process for analyzing the light intensity distribution.

A comparison was actually made between the calculation time in the case of analyzing the light intensity distribution on the wafer with a method (shown in the flowchart of FIG. 2) according to this embodiment and the calculation time in the case of analyzing the light intensity distribution with a method (shown in the flowchart of FIG. 5) according to a comparison example. Both methods were compared with each other in terms of the time required for convolution integration. In the comparison, the size of the mask pattern was 100 μm×100 μm, the coarse grid intervals $dx_s$ and the fine grid intervals $dx_f$ in the method according to this embodiment were set at 100 nm and 20 nm, respectively, while the grid intervals $dx_f$ in the method according to the comparison example were set at 20 nm.

Figure 3:
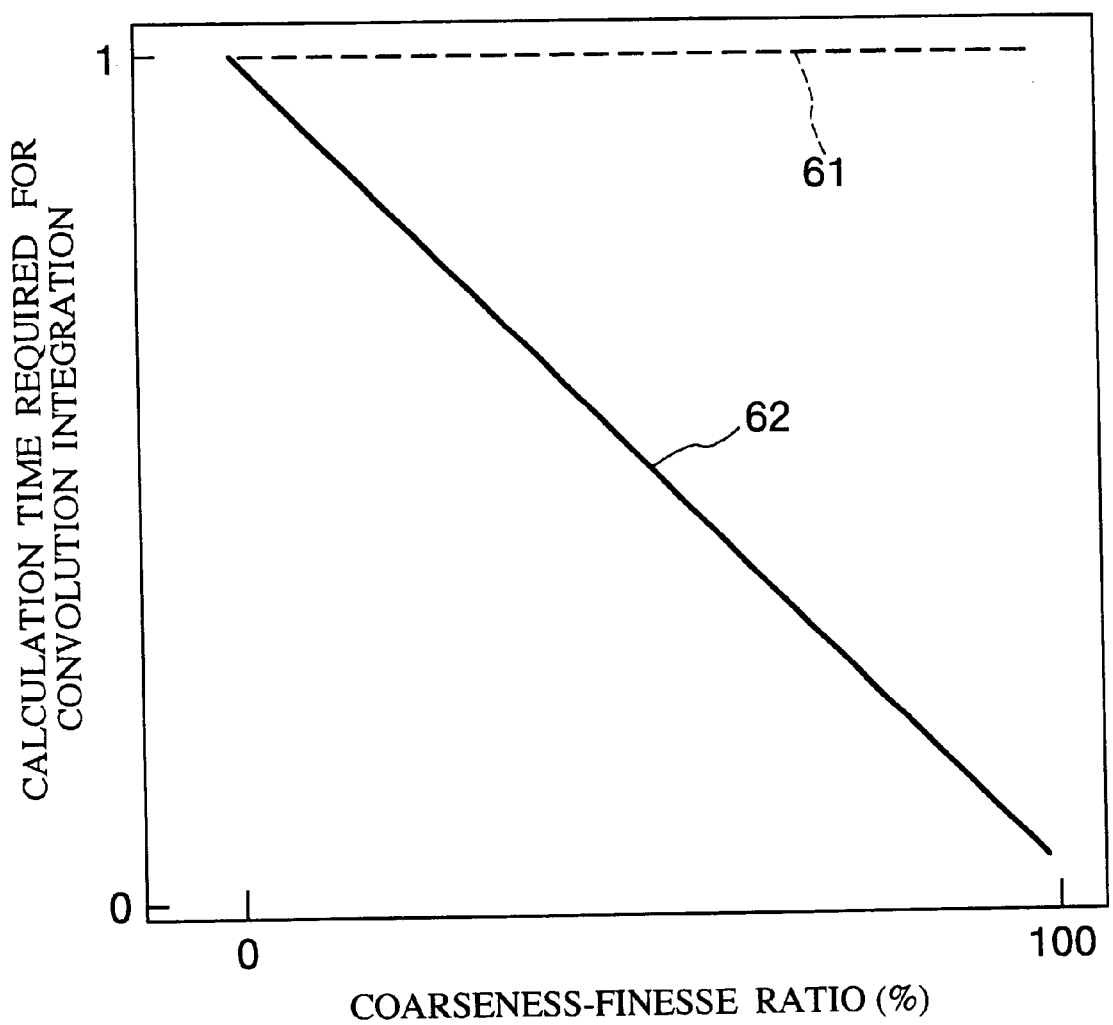
FIG. 3 is a graph showing the relationship between the calculation time required for the analysis of the light intensity distribution and a coarseness-finesse ratio.

FIG. 3 is a graph showing the relationship between the calculation time (plotted against the axis of ordinates) required for convolution integration and the ratio (the coarseness-finesse ratio plotted against the axis of abscissas) of the number of coarse grid rectangular areas to the number of fine grid rectangular areas on the mask pattern 22. In FIG.

3, a broken line 61 indicates the calculation time in the case of the analysis with the method according to a comparative example, while a solid line 62 indicates the calculation time in the case of the analysis with the method according to this embodiment. The calculation time in the analysis with the method according to this embodiment was expressed in relative values when that the calculation time in the analysis with the method according to the comparison example was regarded as "1."

As demonstrated in FIG. 3, when a mask whose rectangular areas were all coarse, i.e., a mask having a coarseness-finesse ratio of 0%, was employed, the method according to this embodiment and that according to the comparative example were the same in calculation time as each other. However, as seen from FIG. 3, the calculation time in the method according to the comparative example was constant regardless of the coarseness-finesse ratio, whereas the calculation time in the method according to this embodiment decreased in accordance with an increase in the coarseness-finesse ratio.

For example, when a mask having a coarseness-finesse ratio of 50% was adopted, the calculation time in the method according to this embodiment was about 53% of the calculation time in the method according to the comparative example. Moreover, when a mask having a coarseness-finesse ratio of 80% was adopted, the calculation time in the method according to this embodiment was about 84% of the calculation time in the method according to the comparative example. From the above, it can be understood that the greater coarseness-finesse ratio of the mask, the more remarkable effect of a reduction in the calculation time for analyzing light intensity distribution.

According to this embodiment, as explained above, the processing unit 1 determines whether the shape of the mask pattern 22 is coarse or fine in each rectangular area ($S_k \times S_k$) cut out from the mask pattern 22. Only with respect to any rectangular area where the shape of the mask pattern 22 has been determined as being fine, the processing unit 1 performs the convolution integration at the fine grid intervals $dx_f$ and calculates the light intensity I (x, y) on the wafer. As regards any other rectangular area where the shape of the mask pattern 22 has been determined as being coarse, the processing unit 1 need not perform the convolution integration at the fine grid intervals. As a result, the number of times the processing unit 1 performs the convolution integration whose calculation procedure requires time is reduced.

This permits the time necessary for analyzing the light intensity distribution on the wafer to be reduced in comparison to conventional cases. In particular, when analyzing the light intensity distribution on a wafer on which light will be projected through a mask pattern having coarse and fine areas mingling together, the time necessary for the analysis can be considerably reduced.

The kernel $\phi 2$, which is stored in the fine grid interval table 24, can be derived by the primary interpolation, based on the kernel $\phi 1$ stored in the coarse grid interval table 23. This enables the time required for calculating the kernel $\phi 2$ to be reduced, compared to the case of calculating the kernel $\phi 2$ while employing the fine grid intervals $dx_f$ in relation to all areas.

In the above-described embodiment, the kernel $\phi 2$, which is stored in the fine grid interval table 24, is obtained by the primary interpolation, based on the kernel $\phi 1$ stored in the coarse grid interval table 23. However, it can be obtained by any other method such as the secondary interpolation. The kernel $\phi 2$ can be obtained independently from the kernel $\phi 1$.

In the above-described embodiment, the light intensities I (x, y) and I (x, y) are obtained employing the same intervals as those at which the mask pattern is divided. However, the light intensities I (X, Y) and I (x, y) can be obtained employing intervals different from those at which the mask pattern is divided.

According to the above-described embodiment, the processing unit 1 executes the program 21 transferred from the storage medium 5 to the storage unit 2, in order to analyze the light intensity distribution. However, the processing unit 1 may execute, as the program 21, a program which the input device 3, functioning as a communication unit that receives programs and data superimposed on or embedded in carrier waves, has received and transferred to the storage unit 2.

According to the above embodiment, the light intensity distribution on the wafer is analyzed dividing its surface area sequentially at two different intervals, i.e., the coarse grid intervals and the fine grid intervals. However, the present invention is applicable also to the case wherein the light intensity distribution on the wafer is analyzed dividing the surface area sequentially at three or more different intervals which decrease gradually.

The present invention can be embodied in any other form, without departing from the sprit and scope thereof. The above-described embodiment is referred to only for explanation and does not limit the present invention. The scope of the present invention is shown by the attached claims rather than the explanations presented above. All modifications made within the meaning of an equivalent of the claims and the range of the claims are to be regarded as being within the scope of the present invention.

This application is based on Japanese Patent Application No. H10-167556 filed Jun. 15, 1998, which is incorporated herein by reference in its entirety.

What is claimed is:

1. A method for analyzing light intensity distribution on a light exposure area where a shape of a mask pattern will be projected through an optical system by exposure light coming from a light source, said analyzing method comprising:

dividing said light exposure area into first areas at predetermined first intervals;

cutting out first portions of said mask pattern which correspond to said first areas;

sequentially determining whether transmission areas which transmit the exposure light and non-transmission areas which do not transmit the exposure light are mingled at the cut-out first portions of said mask pattern;

calculating intensities of light which will be projected on said light exposure area, through use of the first portion of said mask pattern, when it is determined that the transmission areas and the non-transmission areas are not mingled; and dividing each of said first areas into second areas at second intervals smaller than said first intervals and calculating intensities of light which will be projected on said light exposure area, through use of second portions of said mask pattern which correspond to said second areas, when it is determined that the transmission areas and the non-transmission areas are mingled.

2. The analyzing method according to claim 1, wherein:

each of said first areas has a shape of a rectangle with four sides each being 100 $\lambda$/NA to 200 $\lambda$/NA (nm) in length; and each of said second areas has a shape of a rectangle with four sides each being 10 $\lambda$/NA to 20 $\lambda$/NA (nm) in length, where λ presents a wavelength (nm) of the exposure light, while NA represents an numerical aperture of the optical system.

3. The analyzing method according to claim 1, further comprising:
cutting out the second portions of said mask pattern which correspond to said second areas from each of the first portions of said mask pattern, after cutting out the first portions of said mask pattern,
wherein determining whether the transmission areas and the non-transmission areas are mingled at the first portions of said mask pattern is performed by determining whether areas having a transmission factor of 0 and areas having a transmission factor of 1 are mingled at the second portions of said mask pattern.

4. The analyzing method according to claim 1, further comprising:
calculating all optical system term kernels φ1 corresponding to said first areas; and
calculating all optical system term kernels φ2 corresponding to said second areas.

5. The analyzing method according to claim 4, wherein said optical system term kernels φ2 are calculated by performing primary interpolation based on said optical system term kernels φ1.

6. The analyzing method according to claim 4, wherein light intensities I (X, Y) at positions specified by coordinates (X, Y) on said first areas and light intensities I (x, y) at positions specified by coordinates (x, y) on said second areas are calculated respectively by:

$$I(X,Y)=\Sigma\alpha|(F\times\phi1)(X,Y)|^2 \quad (1)$$

$$I(x,y)=\Sigma\alpha|(F\times\phi2)(x,y)|^2 \quad (2)$$

where α represents optical system term kernels, and F represents transmission factors of the first and second portions of said mask pattern which correspond to said first and second areas.

7. The analyzing method according to claim 6, wherein when the light intensities I (X, Y) at the positions specified by the coordinates (X, Y) on said first areas are calculated, the light intensities I (x, y) at the positions specified by the coordinates (x, y) on said second areas corresponding to said first areas are given as I (X, Y).

8. The analyzing method according to claim 1, further comprising:
storing, in a predetermined table, the calculated intensities of light which will be projected on said first areas;
storing, in said predetermined table, the calculated intensities of light which will be projected on said second areas; and
outputting contents of said predetermined table as light intensity distribution analyzing results when light intensities over an entirety of said light exposure area have been stored in said predetermined table.

9. An analyzing apparatus for analyzing light intensity distribution on a light exposure area where a shape of a mask pattern will be projected through an optical system by exposure light coming from a light source, said analyzing apparatus comprising:
a storage unit which stores a program for dividing said light exposure area into first areas at predetermined first intervals, cutting out first portions of said mask pattern which correspond to said first areas, sequentially determining whether transmission areas which transmit the exposure light and non-transmission areas which do not transmit the exposure light are mingled at the cut-out first portions of said mask pattern, calculating intensities of light which will be projected on said light exposure area, through use of the first portions of said mask pattern, when it is determined that the transmission areas and the non-transmission areas are not mingled, and dividing each of said first areas into second areas at second intervals smaller than said first intervals and calculating intensities of light which will be projected on said light exposure area, through use of second portions of said mask pattern which correspond to said second areas, when it is determined that the transmission areas and the non-transmission areas are mingled;
a processing unit which sequentially executes the program stored in said storage unit and analyzes the light intensity distribution on said light exposure area; and
an output device which outputs a result of analysis of the light intensity distribution analyzed by said processing unit.

10. The analyzing apparatus according to claim 9, wherein:
said storage unit stores mask patterns;
said analyzing apparatus further comprises an input device which selects a desired pattern from among said mask patterns stored in said storage unit; and
said processing unit performs processing in accordance with the mask pattern selected by said input device.

11. An analyzing apparatus for analyzing light intensity distribution on a light exposure area where a shape of a mask pattern will be projected through an optical system by exposure light coming from a light source, said analyzing apparatus comprising:
means for dividing said light exposure area into first areas at predetermined first intervals;
means for sequentially determining whether transmission areas which transmit the exposure light and non-transmission areas which do not transmit the exposure light are mingled at first portions of said mask pattern which correspond to said first areas;
means for calculating intensities of light which will be projected on said light exposure area, through use of first portions of said mask pattern, when it is determined that the transmission areas and the non-transmission areas are not mingled; and
means for dividing each of said first areas into second areas at second intervals smaller than said first intervals and calculating intensities of light which will be projected on said light exposure area, through use of second portions of said mask pattern which correspond to said second areas, when it is determined that the transmission areas and the non-transmission areas are mingled.

12. A computer program product including a computer usable medium which contains a computer readable program embodied therein for analyzing light intensity distribution on a light exposure area where a shape of a mask pattern will be projected through an optical system by exposure light coming from a light source, said program executing:
dividing said light exposure area into first areas at predetermined first intervals;
sequentially determining whether transmission areas which transmit the exposure light and non-transmission areas which do not transmit the exposure light are mingled at portions of said mask pattern which correspond to said first areas;

calculating intensities of light which will be projected on said light exposure area, through use of first portions of said mask pattern, when it is determined that the transmission areas and the non-transmission areas are not mingled; and dividing each of said first areas into second areas at second intervals smaller than said first intervals and calculating intensities of light which will be projected on said light exposure area, through use of second portions of said mask pattern which correspond to said second areas, when it is determined that the transmission areas and the non-transmission areas are mingled.

13. A program, embedded in a carrier wave, for analyzing light intensity distribution on a light exposure area where a shape of a mask pattern will be projected through an optical system by exposure light coming from a light source, said program executing:

dividing said light exposure area into first areas at predetermined first intervals;

sequentially determining whether transmission areas which transmit the exposure light and non-transmission areas which do not transmit the exposure light are mingled at portions of said mask pattern which correspond to said first areas;

calculating intensities of light which will be projected on said light exposure area, through use of first portions of said mask pattern, when it is determined that the transmission areas and the non-transmission areas are not mingled; and dividing each of said first areas into second areas at second intervals smaller than said first intervals and calculating intensities of light which will be projected on said light exposure area, through use of second portions of said mask pattern which correspond to said second areas, when it is determined that the transmission areas and the non-transmission areas are mingled.

* * * * *